US 7,225,213 B2

(12) United States Patent
Menkhoff

(10) Patent No.: US 7,225,213 B2
(45) Date of Patent: May 29, 2007

(54) INTERPOLATION FILTER AND METHOD FOR DIGITALLY INTERPOLATING A DIGITAL SIGNAL

(75) Inventor: Andreas Menkhoff, Oberhaching (DE)

(73) Assignee: Infineon Technologies AG, Munich (DE)

( * ) Notice: Subject to any disclaimer, the term of this patent is extended or adjusted under 35 U.S.C. 154(b) by 993 days.

(21) Appl. No.: 10/070,203

(22) PCT Filed: Jul. 2, 2001

(86) PCT No.: PCT/EP01/07543

§ 371 (c)(1),
(2), (4) Date: May 1, 2002

(87) PCT Pub. No.: WO02/03550

PCT Pub. Date: Jan. 10, 2002

(65) Prior Publication Data

US 2002/0184278 A1 Dec. 5, 2002

(30) Foreign Application Priority Data

Jul. 5, 2000 (DE) .................... 100 32 520

(51) Int. Cl.
*G06F 17/10* (2006.01)
(52) U.S. Cl. ...................................... 708/313
(58) Field of Classification Search ................ 708/313
See application file for complete search history.

(56) References Cited

U.S. PATENT DOCUMENTS

| 4,748,578 A | | 5/1988 | Lagadec et al. |
| 5,548,540 A | * | 8/1996 | Staver et al. ............... 708/313 |
| 5,666,299 A | * | 9/1997 | Adams et al. .............. 708/300 |
| 5,717,617 A | * | 2/1998 | Chester ...................... 708/313 |
| 6,279,019 B1 | * | 8/2001 | Oh et al. ..................... 708/300 |
| 6,487,573 B1 | * | 11/2002 | Jiang et al. ................. 708/313 |
| 6,772,181 B1 | * | 8/2004 | Fu et al. ..................... 709/313 |

FOREIGN PATENT DOCUMENTS

| EP | 0561067 A2 | 9/1993 |
| EP | 0696848 A1 | 2/1996 |

OTHER PUBLICATIONS

Dr. Glaab, "Welche Vorteile bietet das Oversampling-Verfahren der GRUNDIG Compact-Disc-Spieler," Grundig Technische Informationen, vol. 31 (No. 1/2), p. 3-7, (Mar. 1, 1984).

(Continued)

*Primary Examiner*—D. H. Malzahn
(74) *Attorney, Agent, or Firm*—Jenkins, Wilson, Taylor & Hunt, P.A.

(57) ABSTRACT

The invention relates to an interpolation filter and to a method for filtering a digital input signal. The interpolation filter has an amplitude characteristic with a low-pass-shaped damping curve in the useful signal frequency range of the digital input signal. The group delay time of the interpolation filter is essentially constant in the useful signal frequency range and can be adjusted within a clock period of the equidistant digital signal.

18 Claims, 5 Drawing Sheets

OTHER PUBLICATIONS

Lagadec et al., "A New Approach to Sampling Rate Synchronization," AES Convention, ( Oct. 8, 1984).
Oppenheim et al., "Zeitdiskrete Signalverarbeitung," p. 125-155.
Fliege, "Multiraten-Signalverarbeitung," p. 32-39, 58, 124-126.
Ramstad, "Digital Methods for Conversion Between Arbitrary Sampling Frequencies," IEEE Transactions on Acoustics, Speech, and Signal Processing (USA), vol. ASSP-32 ( No. 3), p. 577-591, (Jun. 1984).

* cited by examiner

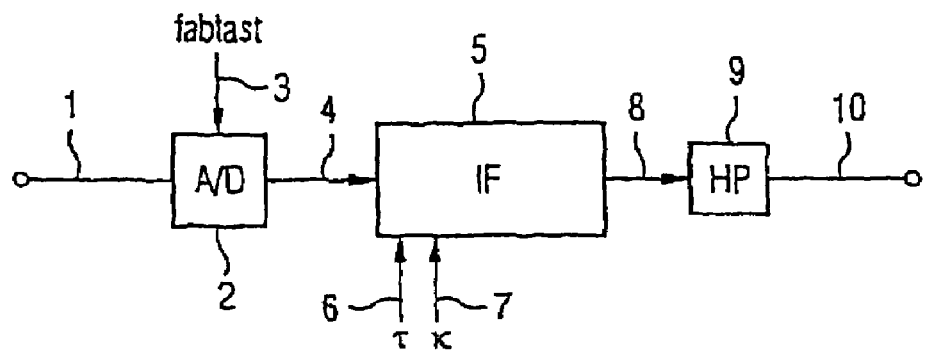
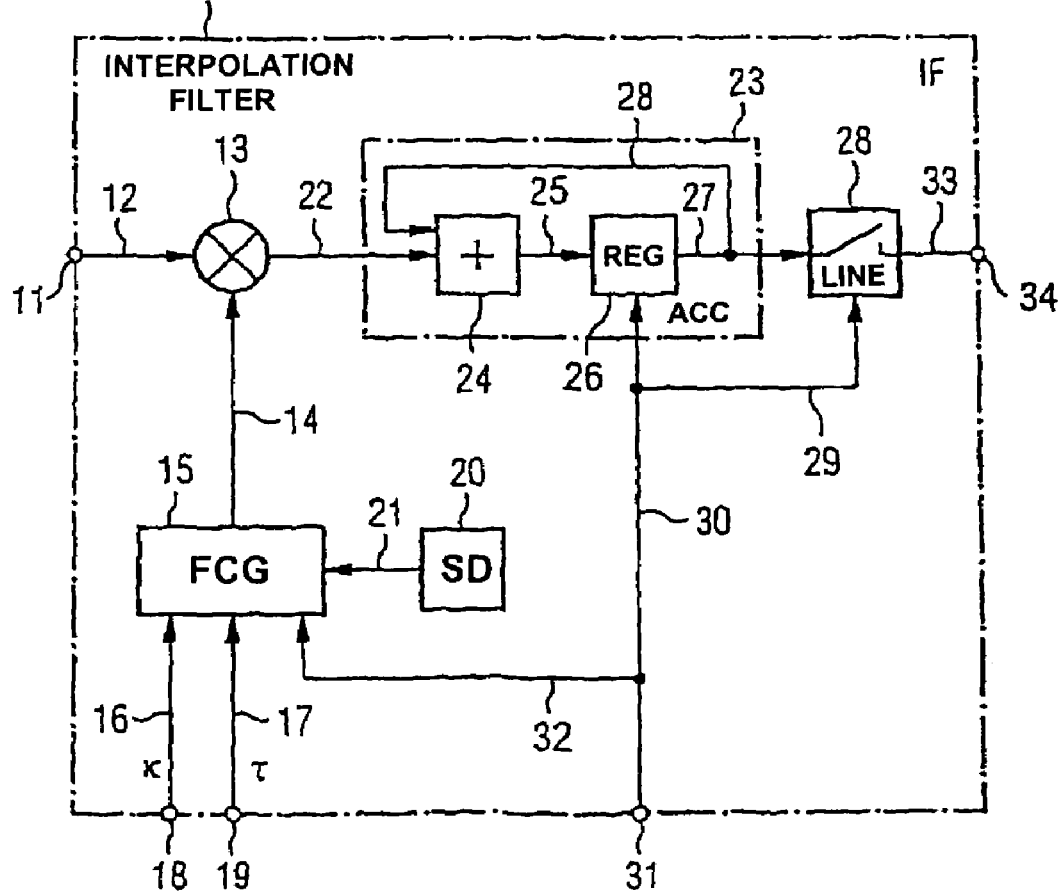

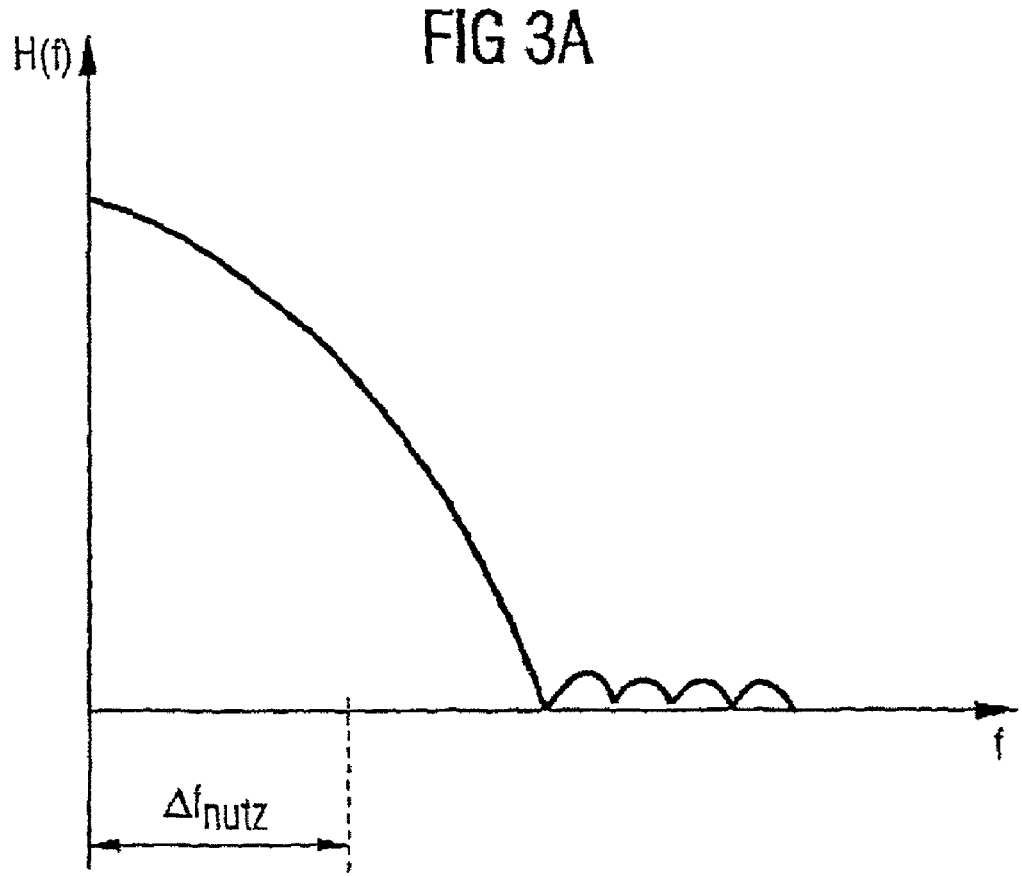

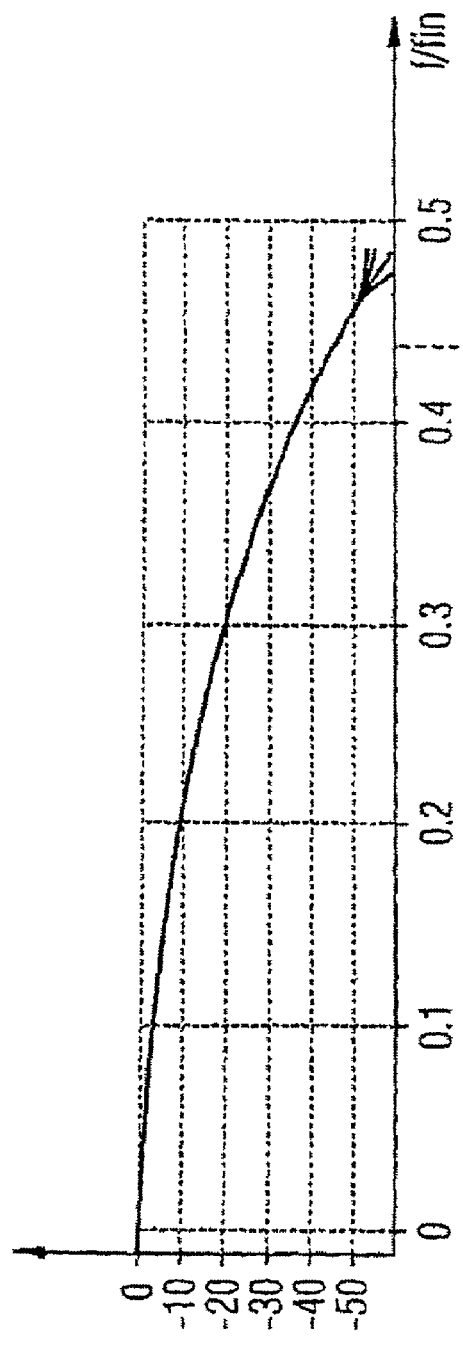
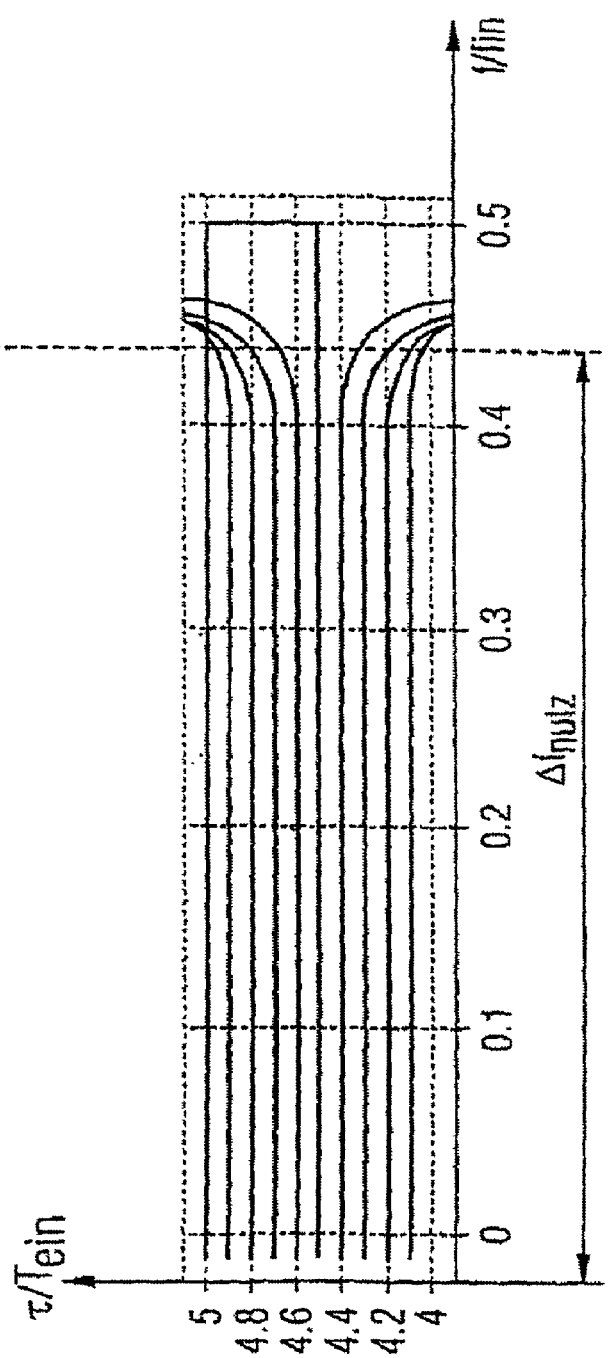
FIG 4A
FIG 4B

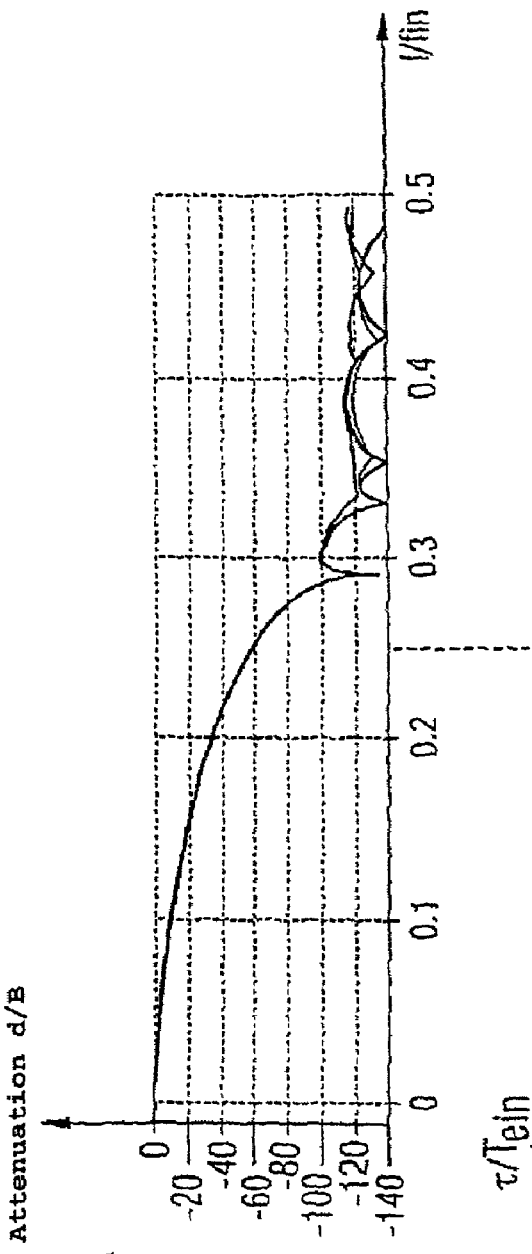
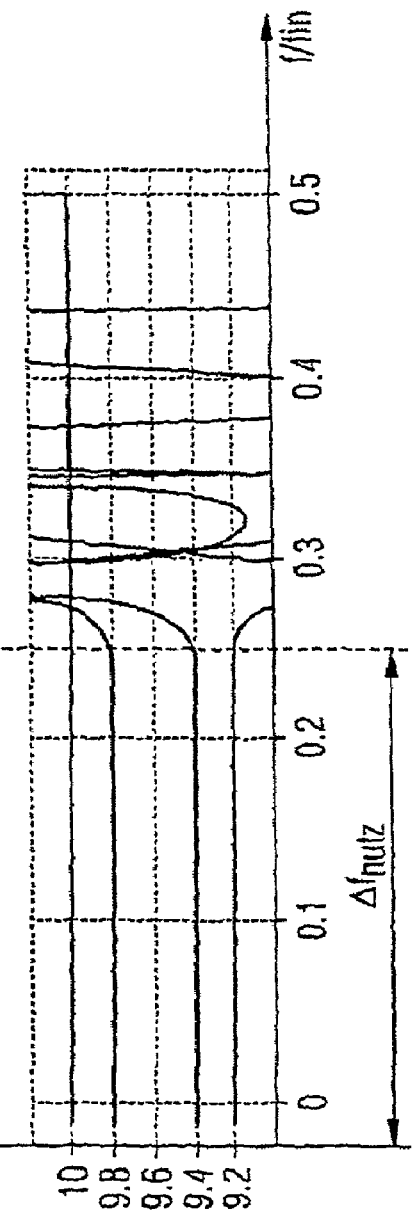
FIG 5A
FIG 5B

INTERPOLATION FILTER AND METHOD FOR DIGITALLY INTERPOLATING A DIGITAL SIGNAL

TECHNICAL FIELD

The invention relates to an interpolation filter and a method for interpolating a digital signal that can be used, in particular, for sampling frequency conversion.

BACKGROUND ART

There are a multiplicity of applications in which it is necessary to vary the frequency of a given digital equidistant time signal by means of digital filtering. Interpolation filters are used as component circuits in digital switching systems in which a change in the sampling frequency of digital signals is necessary. Systems that are concerned only with simple integral sampling frequency ratios are not the subject matter of the invention.

Methods for arbitrarily changing sampling frequencies are described in "IEEE, Transactions of Acoustics, Speech and Signal Processing", Volume ASSP-32, No. 3, July 1984, pages 577–591 under the title of "Digital Methods for Conversion between Arbitrary Sampling Frequencies", author: T. A. Ramstad. The associated circuits are denoted as hybrid systems that consist of a first interpolation filter with a fixed sampling frequency ratio, and a second interpolation filter. The second interpolation filter determines intermediate values that lie arbitrarily in time between the fixed samples of the sampling lattice downstream of the second interpolation filter, and thus permit arbitrary sampling frequency ratios. The first interpolation filter includes an interpolation device and a digital filter as a combination. The interpolation device, which is also denoted as an oversampling device, is used to insert "0" values between the original samples in accordance with an oversampling factor N. A downstream digital filter is the first to smooth the variation in the digital samples, the signal jumps to the 0 values, in particular, being compensated such that the spectrum of the useful signal is not falsified by higher frequency components. The first interpolation filter is designed for this purpose such that relatively large frequency band gaps are formed in the infinitely extending frequency spectrum. It holds in the case of oversampling as well that the frequency spectra are reflected at half the original sampling frequency and multiples thereof. However, a new sampling frequency that forms an integral frequency ratio with the original sampling frequency is to be assumed downstream of the interpolation device and of the digital filter. The digital filter in this case removes the remaining spectral components between the useful signal band and the reflected frequency band in the case of the new sampling frequency and the associated frequency multiples. The digital filter functions in this case simply as a digital lowpass filter that passes the useful signal frequency band and suppresses the frequency components thereabove. In this case, however, a reflection occurs at half the sampling frequency in accordance with the sampling theorem. It follows that a digital lowpass filter cannot suppress the multiples of the sampling frequency.

The spectral signal components in the new sampling frequency and the frequency multiples must be suppressed for the implementation of arbitrary sampling frequency ratios. If these signal interference components are not suppressed, signal interference components occur in the useful signal frequency band during the generation of arbitrary sampling frequency ratios. The first interpolation filter is described in "Proceedings of the IEEE", Volume 61, No. 6, June 1973, pages 692–702, and in the article by R. W. Schafer and L. R. Rabbiner entitled "A Digital Signal Processing Approach to Interpolation".

A method having a hybrid system for sampling frequency conversion is disclosed in EP-A-0 561 067. This system operates with an oversampling factor of N=2, and therefore achieves only a relatively poor signal-to-noise ratio. This poor signal-to-noise ratio is tolerable in the case of this hybrid system since it is used for video signal applications. A second interpolation filter is implemented as a lowpass filter that suppresses all signal components whose frequencies are greater than 1.5 times the value of the original sampling frequency. The analog lowpass response is achieved with the aid of a transverse filter in the case of which the weighting factors of the stored samples depend on a time difference value. Such a lowpass filter suppresses in this case not only the remaining spectral signal components in the frequency multiples of the new sampling frequency, but the entire frequency spectral region above a blocking edge. Although having a comparable transmitting/blocking characteristic, in comparison with a corresponding comb filter arrangement such a lowpass filter can be implemented only at great expense.

The "Journal of Audio Engineering Society", Volume 41, No. 7/8, 1993, pages 539–555 by R. Adams and T. Corn entitled "Theory and VLSI Architectures for Asynchronous Sample Rate Converters" describes a method for a sampling frequency conversion system that treats the use of relatively simple sample-and-hold circuits, on the one hand, and the use of lowpass filters as analog resamplers, on the other hand.

After the N-fold oversampling and filtering there are present in each case in the frequency spectrum downstream of the first interpolation filter in the abovenamed systems interference signal frequency bands whose center frequencies are at the frequency multiples of the new sampling frequency. The frequency bandwidth of each signal interference region is equal in this case to double the frequency bandwidth of the useful signal. If the Nyquist condition for the original digitization is fulfilled, the frequency bandwidth of the interference signal region exhibits in the limiting case at most the value of the original sampling frequency. The position and bandwidth of all the interference regions are defined in the frequency spectrum by the original sampling frequency and the original oversampling factor N. The N-fold oversampling of the original digital sampling frequency has the effect that the relative frequency bandwidth of the interference signal regions in the frequency spectrum is reduced by the factor of 1/N referred to the new sampling frequency. This facilitates the separation of the useful signal frequency band from the respective interference signal frequency region, since the transition region between the transmission and the blocking frequency band for the second interpolation filter is enlarged. This reduces the outlay on circuitry required for the second interpolation filter. However, the price for this is a higher outlay on circuitry for the smoothing filter in the first interpolation filter. There is therefore either a need for a very complicated first interpolation filter and a simple second interpolation filter, for example a linear interpolator, or there is a simple first interpolation filter, for example with a very small oversampling, and a very complicated lowpass filter with the aid of which the analog resampler is implemented.

SUMMARY OF THE INVENTION

EP 0 696 848 A1 therefore proposed for the purpose of digital interpolation of signals a method which leads to a very high signal-to-noise ratio in conjunction with a low outlay on circuitry for the filter system, which consists of a first and second interpolation filter. In this method for digital interpolation of signals, weighting factors or filter coefficients are multiplied by delayed input values of a digital signal that has a first clock frequency, the delay depending on a time difference value which is determined by the interpolation instant and by the time pattern of the first clock signal. The filter coefficients of the interpolation filter are determined by the pulse response h(t) in the time domain. The associated transfer function H(F) has in the frequency domain a signal attenuation characteristic which, with reference to the stop bands, is restricted essentially to the signal interference regions situated at the frequency multiples of the first clock frequency. In this case, at least two mutually adjacent zero points are assigned to each of these signal interference regions in the frequency band. Given the presence of zero points of double order, at least one further zero point of the transfer function H(F) is assigned to at least one of the interference regions and the associated periodic interference regions.

The amplitude response of the interpolation filter described in EP 0 696 841 A1 varies like a comb and, because of the narrowband interference signal frequency bands, exhibits an only very narrowband useful signal frequency band.

It is therefore the object of the present invention to create an interpolation filter for filtering a digital input signal, and a method for digital interpolation of digital input signals that exhibit a broadband useful signal frequency band.

This object is achieved according to the invention by means of an interpolation filter.

The invention creates an interpolation filter for filtering a digital input signal whose amplitude response exhibits a lowpass-type attenuation curve in the useful signal frequency band of the digital input signal.

Because of the broadband useful signal frequency band, the interpolation filter according to the invention offers the advantage that it is also possible to process broadband digital input signals.

A further advantage consists in that the interpolation filter according to the invention can also be used for analog-to-digital converters with very high sampling frequencies since, in practical applications, the entire circuit is calculated for an only onefold to fourfold useful signal bandwidth.

The low sampling frequencies or the long clock periods T of the digital signal processing offer the advantage that the components of the interpolation filter, for example demultiplexers, operate at low frequencies and can therefore be implemented with particular ease in terms of circuitry.

This has the advantage, in turn, that the components of the interpolation filter can be integrated on a small chip area and have a low power consumption.

In an advantageous refinement of the interpolation filter according to the invention, there is connected downstream of the interpolation filter a highpass filter for compensating the lowpass-type amplitude response of the interpolation filter.

This offers the advantage that signal distortions are removed because of the lowpass-type attenuation curve in the filtered output signal of the interpolation filter.

The group delay of the interpolation filter advantageously runs in an essentially constant fashion in the useful signal frequency band of the digital input signal.

The digital input signal that is filtered by the interpolation filter according to the invention is preferably an equidistant digital signal with a predetermined clock pulse period $T_{in}$.

In this case, the group delay of the interpolation filter according to the invention can preferably be set inside the clock pulse period $T_{in}$ of the digital input signal.

The ratio of the clock pulse periods of the digital input signal $T_{in}$ and the digital output signal $T_{aus}$ filtered by the interpolation filter can preferably be set.

In a particularly preferred embodiment, the interpolation filter and the downstream highpass filter together exhibit a sinc filter characteristic.

A further interpolation filter is preferably connected upstream of the interpolation filter for the purpose of constricting the useful signal frequency band.

The upstream interpolation filter is preferably a polyphase filter.

In a particularly preferred embodiment of the interpolation filter according to the invention, the interpolation filter consists of a filter coefficient generator for generating filter coefficients as a function of a base function, a multiplier for multiplying the digital input signal by the generated filter coefficients, and an accumulator for accumulating the digital input signal weighted by the multiplication.

The base function is preferably stored in a storage device of the interpolation filter.

As an alternative to this, in accordance with a further embodiment the interpolation filter according to the invention has a base function generator for generating the base function as a function of fundamental functions.

It is preferred for this purpose to provide a storage device for storing the fundamental functions.

In a preferred embodiment of the interpolation filter according to the invention, the latter has a controllable switching device that can be switched for reading out the weighted digital input signal as digital output signal.

In a preferred embodiment, the accumulator consists of an adder and a register whose output is fed back to an input of the adder.

The invention further creates a method for digital interpolation of a digital input signal.

The invention creates a method for digital interpolation of a digital input signal having the following steps, specifically receiving a digital input signal with a predetermined clock frequency, determining filter coefficients of a settable interpolation filter whose amplitude response exhibits a lowpass-type attenuation curve in the useful signal frequency band of the digital input signal, filtering the digital input signal by means of the set interpolation filter.

In the case of the method according to the invention, the filter coefficients of the interpolation filter are preferably determined as a function of a base function.

This base function is preferably stored in advance in a memory.

As an alternative to this, in accordance with a further embodiment of the method according to the invention the base function is generated from prescribed fundamental functions.

In this case, a first fundamental function is preferably a time-limited power sine function.

The second fundamental function is preferably a first-order sample-and-hold function.

In a particularly preferred embodiment of the method according to the invention, a multiplicity of sets of filter coefficients of the interpolation filter are generated as a function of the base function which in each case exhibit in the useful signal frequency band an essentially identical amplitude response, but different group delays, there subsequently being selected for the purpose of determining the filter coefficients of the interpolation filter that set of filter coefficients whose group delay τ corresponds to the set desired group delay.

BRIEF DESCRIPTION OF THE DRAWINGS

Preferred embodiments of the interpolation filter according to the invention for filtering a digital input signal, and of the method according to the invention for digital interpolation of a digital input signal are described below with reference to the attached figures for explaining features essential to the invention.

In the drawing:

FIG. 1 shows a typical circuit arrangement that contains the interpolation filter according to the invention;

FIG. 2 shows a preferred embodiment of the interpolation filter according to the invention;

FIG. 3a shows an amplitude response of the interpolation filter according to the invention;

FIG. 3b shows the group delay of an interpolation filter according to the invention;

FIG. 4a shows the amplitude response of a first exemplary interpolation filter in accordance with the invention;

FIG. 4b shows the associated group delay curve of the interpolation filter according to the invention with the amplitude response in accordance with FIG. 4a;

FIG. 5a shows the amplitude response of a further interpolation filter in accordance with the invention;

FIG. 5b shows the group delay curve of the interpolation filter with the amplitude response illustrated in FIG. 5a;

FIG. 1 shows a typical circuit arrangement in which the interpolation filter according to the invention is used to filter a digital input signal.

DETAILED DESCRIPTION OF THE INVENTION

Figure 6:
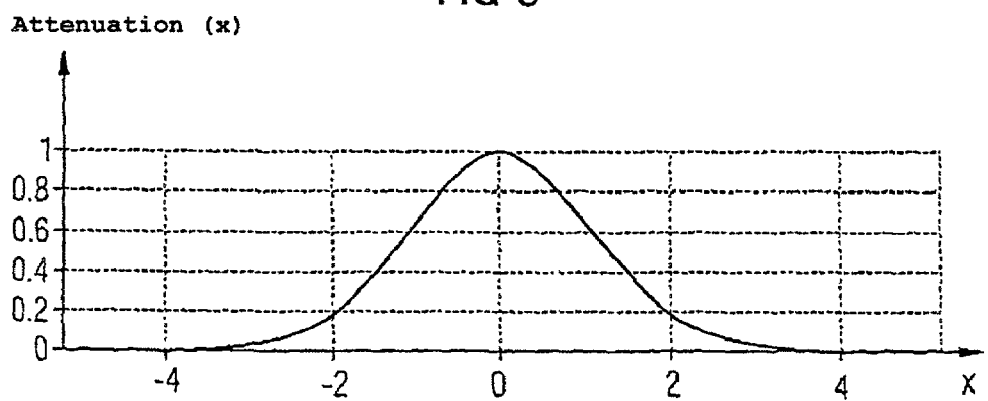
FIG. 6 shows an example of a base function that is used for determining the filter coefficients of the interpolation filter according to the invention.

An analog signal present on a line 1 is sampled by an analog-to-digital converter 2 with a sampling frequency $f_{abtast}$, that is fed via a clock line 3, and a digitized output signal is output by the analog-to-digital converter 2 to the interpolation filter 5 according to the invention via a line 4. The interpolation filter 5 has setting lines 6, 7 for setting the desired group delay τ and the dicimation factor K. The interpolation filter 5 filters the digital input signal present on the line 4 and outputs a filtered digital output signal to a downstream highpass filter 9 via a signal line 8. The highpass filter 9 filters the filtered output signal, present on the line 8, of the interpolation filter 5 according to the invention once again and outputs a corresponding filtered output signal via a line 10.

The digital input signal present at the interpolation filter 5 has a clock frequency $f_{in}$ that corresponds to the sampling frequency $f_{abtast}$ of the analog-to-digital converter 2. The filtered digital output signal present on the signal output line 8 has an output clock frequency $f_{aus}$. The decimation factor K, which can be set via the setting line 7, specifies the ratio between the input frequency $f_{in}$ of the digital input signal and the output frequency $f_{aus}$ of the filtered digital output signal.

$$K = \frac{f_{in}}{f_{aus}} \quad (1)$$

The interpolation filter 5 according to the invention has an amplitude response with a lowpass-type attenuation curve in the useful signal frequency band of the digital input signal present on the line 4. Distortions in the digitized output signal of the interpolation filter 5 occur because of the lowpass-type attenuation curve of the interpolation filter. The downstream highpass filter 9 serves to remove these distortions that have occurred by compensating the lowpass-type amplitude response of the interpolation filter 5 by means of an amplitude response that runs in a complementary fashion thereto.

FIG. 2 shows a preferred embodiment of the interpolation filter 5 according to the invention illustrated in FIG. 1. The interpolation filter 5 has a signal input 11 for receiving a digital input signal. The digital signal input 11 of the interpolation filter 5 is connected via a line 12 to a multiplier 13. The multiplier 13 multiples the digital input signal present on the line 12 by filter coefficients or weighting factors that are present on a line 14 of the interpolation filter 5. The filter coefficients of the interpolation filter 5 are generated in this case in a filter coefficient generator 15 of the interpolation filter 5. The filter coefficient generator 15 is connected via internal setting lines 16, 17 to setting terminals 18, 19 of the interpolation filter 5. The desired decimation factor K can be set via the setting terminal 18 of the interpolation filter 5. The desired group delay τ of the interpolation filter 5 can be set at the setting terminal 19. The filter coefficient generator 15 generates the filter coefficients as a function of a base function. Here, in the embodiment illustrated in FIG. 2 the base function is stored in a storage device 20 and is read out via an internal line 21 by the filter coefficient generator 15.

In an alternative embodiment, the base function is not stored in advance, but is generated by a base function generator as a function of fundamental functions. The fundamental functions are preferably stored in a storage device in this case.

The digital input signal weighted by multiplication passes from the multiplier 13 via an internal line 22 to an accumulator 23 for accumulating the weighted digital input signal. The accumulator 23 includes an adder 24 that is connected on the output side to a register 26 via a line 25. The output line 27 of the register 26 is fed back via a line 28 to a second input of the adder 24. The output line 27 is connected to a switching device 28. The switching device 28 can be controlled via a control line 29 that is coupled to a resetting line 30 for the register 26. The resetting line 30 is connected to a resetting terminal 31 of the interpolation filter 5. Furthermore, an internal resetting line 32 for the filter coefficient generator 15 is connected to the resetting line 30.

The switching device 28 is connected via an internal line 33 to a digital signal output 34 of the interpolation filter 5. The highpass filter 9 illustrated in FIG. 1 can, for example, be connected to the digital signal output 34.

The register 26 of the accumulator 23 can be reset via the resetting line 30, the accumulated digital value buffered in the register 26 being output to the digital signal output 34 for reading out before the resetting via the switching device 28. The resetting terminal 31 of the interpolation filter 5 is preferably connected to a central controller.

FIG. 3a shows the amplitude response of the interpolation filter 5 according to the invention. The amplitude response of the interpolation filter 5 according to the invention has a lowpass-type attenuation curve as early as in the useful signal frequency band $\Delta f_{nutz}$ of the digital input signal. The amplitude characteristic is slightly wavy in the higher-frequency band and has a plurality of zero points. The attenuation in this higher frequency band is very high. The interpolation filter 5 likewise has a certain attenuation, which must be consciously accepted, in the useful signal frequency band or transmission frequency band.

FIG. 3b shows the associated group delay τ of the interpolation filter 5. The group delay τ is the derivative of the phase response of the interpolation filter 5 with respect to frequency. As may be seen from FIG. 3b, the group delay τ of the interpolation filter 5 in the useful signal frequency band $\Delta f_{nutz}$ of the digital input signal is essentially constant and does not diverge until in higher-frequency regions.

FIGS. 4a, 4b show the amplitude response and the associated characteristic of the group delay τ as an example of an interpolation filter 5 according to the invention having the following base function BF(x):

$$BF(x) = \sin(t \cdot (\frac{\pi}{12}))^{12} \sigma(t) - \left(\sin\left(t \cdot \right)\frac{\pi}{12}\right)^{12} \cdot \sigma(t-12) \quad (2)$$

The filter coefficient generator 15 of the interpolation filter 5 uses the stored or generated base functions to generate various sets of filter coefficients, each of which respectively has in the useful signal frequency band $\Delta f_{nutz}$ an essentially equal amplitude response but different group delays τ. As may be seen from FIG. 4a, the amplitude responses that are generated by the various sets of filter coefficients are essentially equal in the useful signal frequency band $\Delta f_{nutz}$ up to f=0.45 $f_{in}$. Here, $f_{in}$ is the frequency of the digital input signal present at the digital data input 11 of the interpolation filter 5.

As may be seen from FIG. 4b, there are, however, differences between the group delays, which are produced by the various sets of filter coefficients that are generated by the filter coefficient generator 15 on the basis of the base function. Inside the useful signal frequency band $\Delta f_{nutz}$, the group delays run in an essentially constant fashion in this case up to f=0.45 $f_{in}$.

The filter coefficient generator 15 compares the group delays τ with the desired group delay $\tau_{soll}$ set via the setting line 17, and selects that set of filter coefficients whose group delay corresponds inside the useful signal frequency band $\Delta f_{nutz}$ to the set desired group delay. That set of filter coefficients is selected in the case of which the deviation between the group delay τ that is constant in the useful signal frequency band and the desired group delay $\tau_{soll}$ is minimal.

FIGS. 5a, 5b show a further example of an interpolation filter 5 according to the invention whose useful signal frequency band is approximately 0.24 $f_{in}$. It may be seen from FIGS. 5a, 5b that the attenuation curve is of lowpass type inside and outside the useful signal frequency band.

FIG. 6 shows the characteristic of the base function BF(x) used, doing so for the interpolation filter illustrated in FIGS. 4a, 4b.

As already mentioned, a highpass filter 9 can be connected downstream of the interpolation filter 5 in order to compensate distortions produced by the lowpass-type attenuation curve of the amplitude response of the interpolation filter 5. The series circuit of the interpolation filter 5 with the highpass filter 9 preferably exhibits a sinc filter characteristic. Furthermore, a further interpolation filter of conventional type can be connected upstream of the interpolation filter 5 for the purpose of constricting the useful signal frequency band. This upstream interpolation filter can be a polyphase filter.

For the purpose of digital interpolation of the digital input signal, which has a specific clock frequency $f_{in}$, the filter coefficients of the settable interpolation filter 5 are determined in such a way that the amplitude response exhibits a lowpass-type attenuation curve in the useful signal frequency range $\Delta f_{nutz}$ of the digital input signal. The filter coefficients of the interpolation filter 5 are determined in this case as a function of a base function BF. This base function BF is either stored in advance in an internal memory 20 of the interpolation filter 5, or generated by a base function generator on the basis of prescribed fundamental functions BF.

Two fundamental functions are preferably used in this case, the first fundamental function being a time-limited power sine function having the following equation:

$$h_1(t) = \sin [t \cdot \pi/n]^m \cdot \sigma(t) - \sin[t \cdot \pi/n]^m \cdot \sigma(t-n) \quad (3)$$

$m, n >= 1m, n \in R,$

σ (t−n) being the unit-step function at the instant n.

The second fundamental function is a first-order sample-and-hold function having the following equation:

$$h_2(t) = \sigma(t) - \sigma(t-n), \quad (4)$$

σ (t−n) being the unit-step function at the instant n.

The base functions BF can either consist of the fundamental functions GF according to equation (3), (4) themselves, or be generated by logic operations of the fundamental functions in the base function generator.

The logic operations comprise the following operations:
a) convolution of two pulse responses of the fundamental functions in the time domain, and formation of a resulting new pulse response as base function,
b) shifting and multiplying the transfer functions in the frequency domain, and forming a resulting new pulse response as base function,
c) shifting and adding two equal pulse responses in the time domain, and forming a resulting new pulse response as base function,
d) adding two different pulse responses in the time domain, and forming a resulting, new pulse response as base function,
e) compressing and expanding, or expanding and compressing the pulse responses in the time domain or frequency domain,
f) raising the pulse response in the time domain to the power of a rational number, and
g) windowing the pulse response with the aid of a prescribed window.

If the calculation of the base function in real time is too expensive in terms of circuitry, as an alternative to the generation of the base function it is possible for the base function to be stored as a sampled pulse response in a storage device 20, for example a ROM, of the interpolation filter 5. In this case, the values stored in the base function memory 20 are read out by the filter coefficient generator 15. It is also possible for the pulse response of the base function BF to be approximated by polynomials as a whole or in sections.

The base functions BF can also be generated by multiple logic operations on the basis of the fundamental functions GF.

The interpolation filter according to the invention meets various requirements.

The differences between the amplitude responses of the individual polyphases are minimized for a prescribed outlay on circuitry.

The group delays $\tau$ of the individual polyphases continue to run in an essentially constant fashion inside a clock pulse period $T_{in}$ of the digital input signal.

Each individual polyphase has amplitude differences of at least 2 dB.

Furthermore, the interpolation filter according to the invention has a lowpass characteristic.

It is also possible to construct hybrid systems with the aid of the interpolation filter according to the invention. In this case, the interpolation filter is split up into two polyphases, two architectures being on offer for the implementation. Here, in the case of the first architecture the even filter coefficients are multiplied by one polyphase, and the odd filter coefficients are multiplied by the other polyphase. In the case of the other architecture, a lowpass signal is generated by adding the two polyphases. Thereupon, this signal is convoluted with the sampled time-continuous filter. A high pass signal is likewise generated, by subtracting one polyphase from the other. Thereupon, each second sample is inverted in the case of the time-continuous filter before carrying out signal convolution. Finally, the convoluted lowpass and high pass signals are added to one another.

Figure 7:
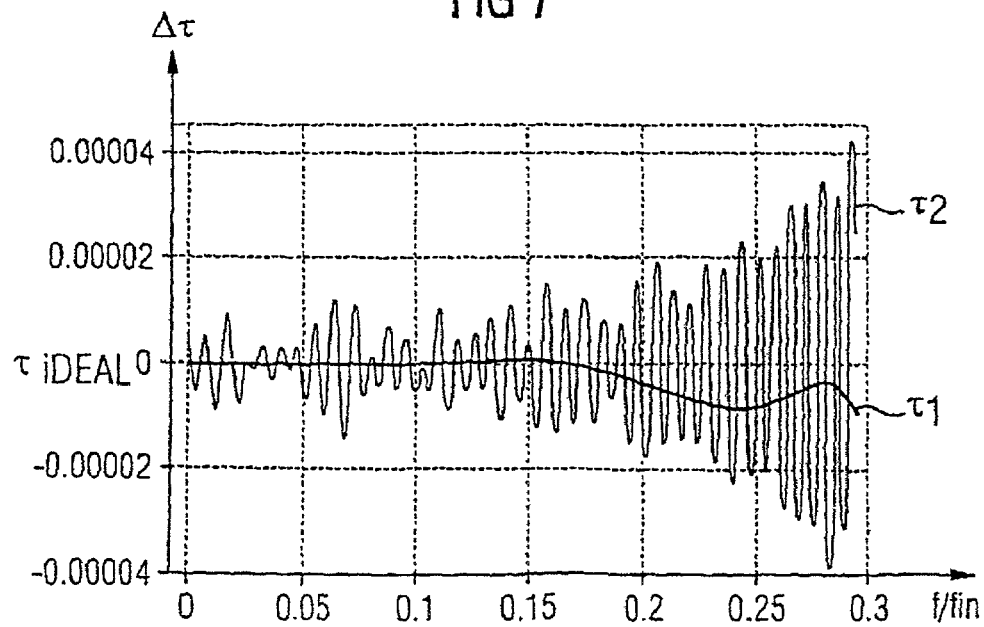
FIG. 7 shows the curve of the group delay of a preferred embodiment of the interpolation filter according to the invention with the base function illustrated in FIG. 6, by comparison with the curve of the group delay of an interpolation filter according to the prior art.

FIG. 7 shows the group delay characteristic of an interpolation filter 5 according to the invention by comparison with the group delay characteristic of a conventional interpolation filter according to the prior art, which exhibits a sinc filter characteristic.

In the example illustrated in FIG. 7, the interpolation filter 5 according to the invention is an interpolation filter with 10 generated filter coefficients that each have a word length of 10 bits. In this case, the base function specified in equation (2) is used as base function for generating the filter coefficients. The interpolation filter 5 according to the invention generates the group delay characteristic $\tau_1$ which, as may be seen from FIG. 7, deviates only minimally from the set ideal group delay.

By comparison, the conventional interpolation filter generates a group delay characteristic $\tau_2$ that deviates increasingly from the ideal or set group delay at higher frequencies. In the example illustrated in FIG. 7, the conventional interpolation filter, which has a group delay characteristic $\tau_2$, is an interpolation filter with 256 filter coefficients that each have a word length of 27 bits.

In the example illustrated in FIG. 7, because of the high number of filter coefficients and the large word length of the filter coefficients, the conventional interpolation filter can be constructed only with a very high outlay on circuitry that is far above the outlay on circuitry for the interpolation filter 5. As shown in FIG. 7, despite the higher outlay on circuitry in the case of the conventional interpolation filter (5), the group delay characteristic $\tau_2$ in the case of the conventional interpolation filter 5 deviates substantially more sharply from the ideal desired group delay ($\tau_{ideal}$) than does the group delay characteristic $\tau_1$ in the case of the interpolation filter according to the invention.

| List of reference numerals | |
|---|---|
| 1 | Line |
| 2 | Analog-to-digital converter |
| 3 | Clock signal line |
| 4 | Line |
| 5 | Interpolation filter |
| 6 | Setting line |
| 7 | Setting line |
| 8 | Signal output line |
| 9 | Highpass filter |
| 10 | Line |
| 11 | Digital signal input |
| 12 | Line |
| 13 | Multiplier |
| 14 | Line |
| 15 | Filter coefficient calculator |
| 16 | Setting line |
| 17 | Setting line |
| 18 | Setting terminal |
| 19 | Setting terminal |
| 20 | Storage device |
| 21 | Line |
| 22 | Line |
| 23 | Accumulator |
| 24 | Adder |
| 25 | Line |
| 26 | Register |
| 27 | Line |
| 28 | Feedback line |
| 29 | Resetting line |
| 30 | Resetting line |
| 31 | Resetting terminal |
| 32 | Resetting line |
| 33 | Output line |
| 34 | Output terminal |

What is claimed is:

1. An interpolation filter for sampling frequency conversion of a digital input signal, the interpolation filter comprising:
   (a) a filter coefficient generator for generating various sets of filter coefficients as a function of a base function (BF), wherein the base function (BF) is generated on the basis of a time-limited power sine function $h_1(t)$, wherein each of the various sets of filter coefficients has in a useful signal frequency band $\Delta f_{nutz}$ of the digital input signal as an essentially equal amplitude response and different group delays $\tau$, wherein the filter coefficient generator selects that filter coefficient set whose group delay $\tau$ has a minimal deviation from a set desired group delay;
   (b) a multiplier for multiplying the digital input signal by the filter coefficients of the selected filter coefficient set; and
   (c) an accumulator for accumulating the digital input signal weighted by the multiplication with the filter coefficients of the selected filter coefficient set.

2. The interpolation filter according to claim 1, wherein the base function (BF) is generated by a logic operation from the time-limited power sine function $h_1(t)$ and a first order sample and hold function $h_2(f)$.

3. The interpolation filter as claimed in claim 1, wherein connected downstream of the interpolation filter is a highpass filter for compensating the lowpass-type amplitude response.

4. The interpolation filter as claimed in claim 3, wherein the interpolation filter and the downstream highpass filter together exhibit a sine filter characteristic.

5. The interpolation filter as claimed in claim 1, wherein the group delay τ of the interpolation filter runs is essentially constant in the useful signal frequency band $\Delta f_{nutz}$.

6. The interpolation filter as claimed in claim 1, wherein the digital input signal is an equidistant digital signal with a predetermined clock pulse period $T_{in}$.

7. The interpolation filter as claimed in claim 1, wherein the group delay τ of the interpolation filter can be set inside a clock pulse period $T_{in}$ of the digital input signal.

8. The interpolation filter as claimed in claim 1, wherein the ratio of the clock pulse periods of the digital input signal $T_{in}$ and the digital output signal $T_{aus}$ filtered by the interpolation filter can be set.

9. The interpolation filter as claimed in claim 1, wherein a further interpolation filter can be connected upstream of the interpolation filter for the purpose of constricting the useful signal frequency band $\Delta f_{nutz}$.

10. The interpolation filter as claimed in claim 9, wherein the interpolation filter that can be connected upstream is a polyhase filter.

11. The interpolation filter as claimed in claim 1, wherein by a storage device is provided for storing the base function (BF).

12. The interpolation filter as claimed in claim 1, wherein a controllable switching device is provided for reading out the weighted digital input signal as a digital output signal.

13. The interpolation filter as claimed in claim 1, wherein the accumulator comprises an adder and a register whose output is fed back to an input of the adder.

14. A method for digital interpolation of a digital input signal, the method comprising:
(a) receiving a digital input signal with a predetermined clock frequency $f_{in}$;
(b) providing a base function (BF) on the basis of a time-limited power sine function $h_1(t)$;
(c) calculating various sets of filter coefficients as a function on the base function (BF),
    wherein each of the various sets of filter coefficients comprises, in a useful signal frequency $\Delta f_{nutz}$ of the digital input signal, an essentially equal amplitude response and different group delays τ;
(d) selecting a filter coefficient set whose group delay τ has a minimal deviation from a set desired group delay $\tau_{SOLL}$;
(e) multiplying the digital input signal by the filter coefficients of the selected filter coefficient set; and
(f) accumulating of the digital input signal weighted by the multiplication with the filter coefficients of the selected filter coefficient set.

15. The method according to claim 14, comprising generating the base function (BF) by a logic operation from the time-limited power sine function $h_1(t)$ and a first order sample function $h_2(t)$.

16. The method as claimed in one of claims 14 and 15, comprising storing the base function (BF) in a memory.

17. The method as claimed in claim 14, in which the time-limited power sine function $h_1(t)$ function is as follows:

$$h_1(t) = \sin[t \cdot \pi/n]^m \cdot \sigma(t) - \sin[t \cdot \pi/n]^m \cdot \sigma(t-n)$$

m, n >= 1 m, n ∈ R,

σ(t−n) being the unit-step function at the instant n.

18. The method as claimed in claim 15, in which the first order sample function $h_2(t)$ function is as follows:

$$h_2(t) = \sigma(t) - \sigma(t-n),$$

σ(t−n) being the unit-step function at the instant n.

* * * * *